United States Patent
Yamamoto

(10) Patent No.: US 10,062,391 B2
(45) Date of Patent: Aug. 28, 2018

(54) AUDIO PROCESSING DEVICE

(71) Applicant: Onkyo Corporation, Osaka (JP)

(72) Inventor: Kuniaki Yamamoto, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 15/391,980

(22) Filed: Dec. 28, 2016

(65) Prior Publication Data

US 2017/0194017 A1   Jul. 6, 2017

(30) Foreign Application Priority Data

Jan. 6, 2016 (JP) .................................. 2016-001150
Sep. 13, 2016 (JP) .................................. 2016-178772

(51) Int. Cl.
| G10L 21/0208 | (2013.01) |
| H03G 3/34 | (2006.01) |
| H03G 3/30 | (2006.01) |
| H03M 1/08 | (2006.01) |
| H03M 1/66 | (2006.01) |
| H04R 3/00 | (2006.01) |

(52) U.S. Cl.
CPC ....... *G10L 21/0208* (2013.01); *H03G 3/3005* (2013.01); *H03G 3/34* (2013.01); *H03M 1/0872* (2013.01); *H03M 1/66* (2013.01); *H04R 3/00* (2013.01)

(58) Field of Classification Search
CPC ...... H03F 1/305; H03F 2200/03; H03F 3/187; H04R 3/00; H04R 5/04; H04R 31/00; H04R 31/006; Y10T 29/49005; G06F 3/165
USPC ...................... 381/94.5, 123; 29/594; 700/94
See application file for complete search history.

(56) References Cited

U.S. PATENT DOCUMENTS 6,874,045 B2 * 3/2005 Nagasawa .............. G11B 20/10
                                                        375/247
2002/0169603 A1   11/2002 Sculley
(Continued)

FOREIGN PATENT DOCUMENTS

| JP | H08-107359 | 4/1996 |
| JP | 2001-036999 | 2/2001 |
| JP | 2002-319237 | 10/2002 |

OTHER PUBLICATIONS

Texas Instruments:"PCM1754 Minimizing Pop and Click", May 1, 2015(May 1, 2015) https://e2e.ti.com/support/data_converters/audio_converters/w/design_notes/3120.pcm1754-minimizing-pop-and-click.

(Continued)

*Primary Examiner* — Rasha Al Aubaidi
(74) *Attorney, Agent, or Firm* — Renner Otto Boisselle & Sklar, LLP

(57) ABSTRACT

To prevent that the noise occurs at timing switching between PCM data and DSD data by a simple configuration.

An AV receiver 1 includes a mute circuit 5 that mutes output from a DAC 4, a detection circuit 6 that detects that a digital audio signal is zero data and supplies a detection signal, a microcomputer 2 that supplies a control signal at timing switching from PCM data to DSD data before switches from PCM mode that the DAC 4 converts PCM data into an analog audio signal to DSD mode that the DAC 4 converts DSD data into the analog audio signal, and an AND circuit 7 that activates the mute circuit 5 in case that the detection signal from the detection circuit 6 and the control signal from the microcomputer 2 are supplied.

7 Claims, 9 Drawing Sheets

(56) References Cited

U.S. PATENT DOCUMENTS

| | | |
|---|---|---|
| 2004/0213350 A1 | 10/2004 | Frith et al. |
| 2006/0126864 A1* | 6/2006 | Ryoo .................. H03F 1/305 381/94.5 |
| 2013/0223646 A1 | 8/2013 | Lee et al. |

OTHER PUBLICATIONS

Shige Nakao et al: "C-8 A 117-dB D-Range Current-Mode Multi-Bit Audio DAC for PCM and DSD Audio Playback", AES Convention, Sep. 1, 2000 (Sep. 1, 2000).

"About the way of DoP method-DSD native DA conversion by DA converter "MY-D 3000""; Jun. 11, 2013; http://www.glasstone.co.jp/myd3000_dsd.htm (cited in the specification).

* cited by examiner

Fig. 3

| A | B | Y |
|---|---|---|
| L (DATA EXISTING) | L | L (MUTE:OFF) |
| L (DATA EXISTING) | H | L (MUTE:OFF) |
| H (ZERO DATA) | L | L (MUTE:OFF) |
| H (ZERO DATA) | H | H (MUTE:ON) |

Fig. 4

| TRANSITION TURN | A | B | Y | MODE | OUTPUT |
|---|---|---|---|---|---|
| 1 | L (PCM MUSIC SIGNAL) | L | L | PCM | NORMAL OUTPUT |
| 2 | H (ZERO DATA) | L | L | PCM | DAC SILENCE OUTPUT STATE |
| 3 | H (ZERO DATA) | H | H | PCM | MUTE CIRCUIT: ON |
| 4 | H (ZERO DATA) | H | H | DSD | MUTE CIRCUIT: ON |
| 5 | L (DSD MUTE SIGNAL) | H | L | DSD | DAC SILENCE OUTPUT STATE |
| 6 | L (DSD MUSIC SIGNAL) | H | L | DSD | NORMAL OUTPUT |

Fig. 6

| TRANSITION TURN | A | B | Y | MODE | OUTPUT |
|---|---|---|---|---|---|
| 1 | L (DSD MUSIC SIGNAL) | H | L | DSD | NORMAL OUTPUT |
| 2 | L (DSD MUTE SIGNAL) | H | L | DSD | DAC SILENCE OUTPUT STATE |
| 3 | H (ZERO DATA) | H | H | DSD | MUTE CIRCUIT: ON |
| 4 | H (ZERO DATA) | H | H | PCM | MUTE CIRCUIT: ON |
| 5 | H (ZERO DATA) | L | L | PCM | DAC SILENCE OUTPUT STATE |
| 6 | L (PCM MUSIC SIGNAL) | L | L | PCM | NORMAL OUTPUT |

AUDIO PROCESSING DEVICE

BACKGROUND OF THE INVENTION

1. Field of the Invention

The present invention relates to an audio processing device that performs audio signal processing to a digital audio signal.

2. Description of the Related Art

Conventionally, a digital audio signal to which an audio processing device performs audio signal processing is mainly PCM (Pule Code Module) data (first digital audio signal) in which sampling frequency is 44.1 kHz and the number of quantum bits is 16 bits. In recent years, there has been DSD (Direct Stream Digital) data (second digital audio signal) in which sampling frequency is 2.8224 MHz (=44.1 kHz×64) and the number of quantum bits is 1 bit as digital audio data.

In the audio processing device, in case that a D/A converter that can D/A-convert both PCM data and DSD data is used, noise occurs at timing switching from PCM data to DSD data. In case of PCM data, mute is zero data (a signal is low level.). However, in case of DSD data, when zero data continues to be input to the D/A converter, a signal becomes max level of minus side with full scale. At timing switching from PCM data to DSD data, moment that a signal that is input to the D/A converter is PCM data and the D/A converter is DSD mode that D/A converts DSD data exists. For this reason, an analog audio signal is output from the D/A converter with full scale and noise occurs.

Further, at timing switching from DSD data to PCM data, noise occurs. A mute signal of DSD data is not zero data and a signal of "01101001", for example. For this reason, in a state that the mute signal of DSD data is input to the D/A converter, if the D/A convertor is switched to PCM mode, noise occurs.

In "About the Way of DoP Method-DSD Native DA Conversion by DA Converter "MY-D3000"", Jun. 11, 2013, to prevent that noise occurs at timing switching from DSD data to PCM data, outputting a signal corresponding to 0V of DSD data (binary digit: 01101001) to a D/A converter is described. However, in such teaching, processing that outputs the signal corresponding to 0V of DSD data is added, and there is a problem that process is complicated.

SUMMARY OF THE INVENTION

An objective of the present invention is to prevent that noise occurs at timing switching between a first digital audio signal and a second digital audio signal by a simple configuration.

An audio processing device comprising: a D/A converter that converts a first digital audio signal and a second digital audio signal in which data format is different from the first digital audio signal into an analog audio signal; a mute section that mutes output from the D/A converter; a detection section that detects that a digital audio signal is a zero signal and supplies a detection signal; a controller that supplies a control signal at timing switching from the first digital audio signal to the second digital audio signal before switches the D/A converter from a first mode that the D/A converter converts the first digital audio signal into the analog audio signal to a second mode that the D/A converter converts the second digital audio signal into the analog audio signal; and a mute controller that activates the mute section in case that the detection signal form the detection section and the control signal from the controller are supplied to the mute controller.

In the present invention, a detection section detects that a digital audio signal is a zero signal and supplies a detection signal. Further, at timing switching from a first digital audio signal to a second digital audio signal, a controller supplies a control signal before it switches a D/A converter from a first mode that the D/A converter converts the first digital audio signal into an analog audio signal to a second mode that the D/A converter converts the second digital audio signal into the analog audio signal. Further, a mute controller activates a mute section in case that the detection signal from the detection section and the control signal from the controller are supplied. Thus, at timing switching from the first digital audio signal to the second digital audio signal, even if the D/A convertor is the second mode, output from the D/A convertor is muted and noise can be prevented from occurring. Further, output of the D/A convertor can be muted quickly without via the controller because the detection section outputs the detection signal to the mute controller and the mute controller activates the mute section.

Like this, according to the present invention, at timing switching from the first digital audio signal to the second digital audio signal, noise can be prevented from occurring by a simple configuration adding the detection section and the mute controller to a conventional audio processing device that includes the D/A converter, the mute section, and the controller.

An audio processing device comprising: a D/A converter that converts a first digital audio signal and a second digital audio signal in which data format is different from the first digital audio signal into an analog audio signal; a mute section that mutes output from the D/A converter; a detection circuit that detects that a digital audio signal is a zero signal and supplies a detection signal; a controller that switches D/A converter from a second mode that the D/A converter converts the second digital audio signal into the analog audio signal to a first mode that the D/A converter converts the first digital audio signal into the analog audio signal at timing switching from the second digital audio signal to the first digital audio signal after outputs a control signal in case that the detection signal is supplied to the controller; and a mute controller that activates the mute section in case that the detection signal form the detection section and the control signal from the controller are supplied to the mute controller.

In the present invention, the detection section detects that a digital audio signal is a zero signal and outputs a detection signal. Further, at timing switching from a second digital audio signal to a first digital audio signal, in case that the detection signal is supplied to a controller, the controller supplies a control signal. Next, the controller switches a D/A convertor from a second mode that the D/A convertor converts a second digital audio signal into the analog audio signal to a first mode that the D/A convertor converts a first digital audio signal into the analog audio signal. Further, in case that the detection signal from the detection section and the control signal from the controller are supplied to a mute controller, the mute controller activates the mute section. Like this, at timing switching from the second digital audio signal to the first digital audio signal, noise can be prevented from occurring because the detection section detects that a digital audio signal changes from a mute signal of the second digital audio signal to a zero signal of the first digital audio signal and switches the D/A convertor from the second mode to the first mode.

Like this, according to the present invention, at timing switching from the second digital audio signal to the first digital audio signal, noise can be prevented from occurring by a simple configuration adding the detection section and the mute controller to a conventional audio processing device that includes the D/A convertor, the mute section, and the controller.

Preferably, wherein the detection section supplies a high level signal as the detection signal, the controller supplies a high level signal as the control signal, the mute controller is an AND section that calculates logical AND of the signal supplied from the detection section and the signal supplied from the controller, and the mute section mutes output from the D/A converter when the high level signal is supplied to the mute section from the mute controller.

In the present invention, the mute controller is an AND section that calculates logical AND of the signal supplied from the detection section and the signal supplied from the controller. For this reason, in case that the detection signal that is a high level signal and the control signal that is a high level signal are supplied to the mute controller, the mute controller supplies the high level signal. The mute section mutes output from the D/A convertor when the high level signal from the mute controller is supplied to the mute section. Like this, according to the present invention, at timing switching between the first digital audio signal and the second digital audio signal, noise can be prevented from occurring by a simple circuit configuration using the AND section.

Preferably, wherein the detection section supplies a high level signal as the detection signal, the controller supplies a high level signal as the control signal, the mute controller is a three state buffer to which the signal that is supplied from the detection section and the signal that is supplied from the controller are input, and the mute section mutes output from the D/A converter when the high level signal is supplied to the mute section from the mute controller.

In the present invention, the mute controller is a three state buffer to which the signal supplied from the detection section and the signal supplied from the controller are input. For this reason, in case that the detection signal that is a high level signal and the control signal that is a high level signal are supplied to the three state buffer, the mute controller supplies the high level signal. The mute section mutes output from the D/A convertor when the high level signal from the mute controller is supplied to the mute section. Like this, according to the present invention, at timing switching between the first digital audio signal and the second digital audio signal, noise can be prevented from occurring by a simple circuit configuration using the three state buffer.

Preferably, wherein the detection section has an npn type bipolar transistor, the digital audio signal is input to a base of the bipolar transistor, a collector of the bipolar transistor is connected to a power source via a resistor, an emitter of the bipolar transistor is connected to a ground potential, and output of the detection section is between the resistor and the collector of the bipolar transistor.

In the present invention, the digital audio signal is input to a base of an npn type bipolar transistor configuring the detection section. Further, a collector of the bipolar transistor is connected to a power source via a resistor. Further, an emitter of the bipolar transistor is connected to a ground potential. Further, output of the detection section is between the resistor and the collector of the bipolar transistor.

Therefore, in case that the digital audio signal is a zero signal, the bipolar transistor becomes OFF state when the low level signal is input to the base of the bipolar transistor. For this reason, the detection section supplies a high level signal as the detection signal from output. Like this, according to the present invention, that the digital audio signal is the zero signal can be detected by the detection section of a simple circuit configuration using the bipolar transistor.

Preferably, wherein the controller switches the D/A converter from the first mode to the second mode after it supplies the control signal.

Preferably, wherein the first digital audio signal is PCM data, and the second digital audio signal is DSD data.

In the present invention, the detection section detects that the digital audio signal is the zero signal and supplies the detection signal. Further, at timing switching from PCM data to DSD data, the controller supplies the control signal before it switches a D/A converter from the first mode that the D/A converter converts PCM data into the analog audio signal to the second mode that the D/A converter converts DSD data into the analog audio signal. Further, the mute controller activates the mute section in case that the detection signal from the detection section and the control signal from the controller are supplied. Thus, at timing switching from PCM data to DSD data, even if the D/A convertor is the second mode, output from the D/A convertor is muted and noise can be prevented from occurring.

Like this, according to the present invention, at timing switching from PCM data to DSD data, noise can be prevented from occurring by a simple configuration adding the detection section and the mute controller to a conventional audio processing device that includes the D/A converter, the mute section, and the controller.

In the present invention, the detection section detects that the digital audio signal is the zero signal and supplies the detection signal. Further, at timing switching from DSD data to PCM data, in case that the detection signal is supplied to the controller, the controller supplies the control signal. Next, the controller switches the D/A convertor from the second mode that the D/A convertor converts DSD data into the analog audio signal to the first mode that the D/A convertor converts PCM data into the analog audio signal. Further, in case that the detection signal from the detection section and the control signal from the controller are supplied to the mute controller, the mute controller activates the mute section. Like this, at timing switching from DSD data to PCM data, noise can be prevented from occurring because the detection section detects that the digital audio signal changes from the mute signal of DSD data to the zero signal of PCM data and switches the D/A convertor from the second mode to the first mode.

Like this, according to the present invention, at timing switching from DSD data to PCM data, noise can be prevented from occurring by a simple configuration adding the detection section and the mute controller to a conventional audio processing device that includes the D/A convertor, the mute section, and the controller.

According to the present invention, at timing switching between a first digital audio signal and a second digital audio signal, noise can be prevented from occurring by a simple configuration.

BRIEF DESCRIPTION OF THE DRAWINGS

FIG. 3 is a diagram illustrating logic of an input signal to an AND circuit and an output signal from the AND circuit.

FIG. 4 is a diagram illustrating transition of an input signal to the AND circuit and an output signal from the AND circuit at the timing switching from PCM data to DSD data.

FIG. 6 is a diagram illustrating transition of an input signal to an AND circuit and an output signal from the AND circuit at the timing switching from DSD data to PCM data.

DETAILED DESCRIPTION OF THE PREFERRED EMBODIMENTS

An embodiment of the present invention is described below.

First Embodiment

Figure 1:
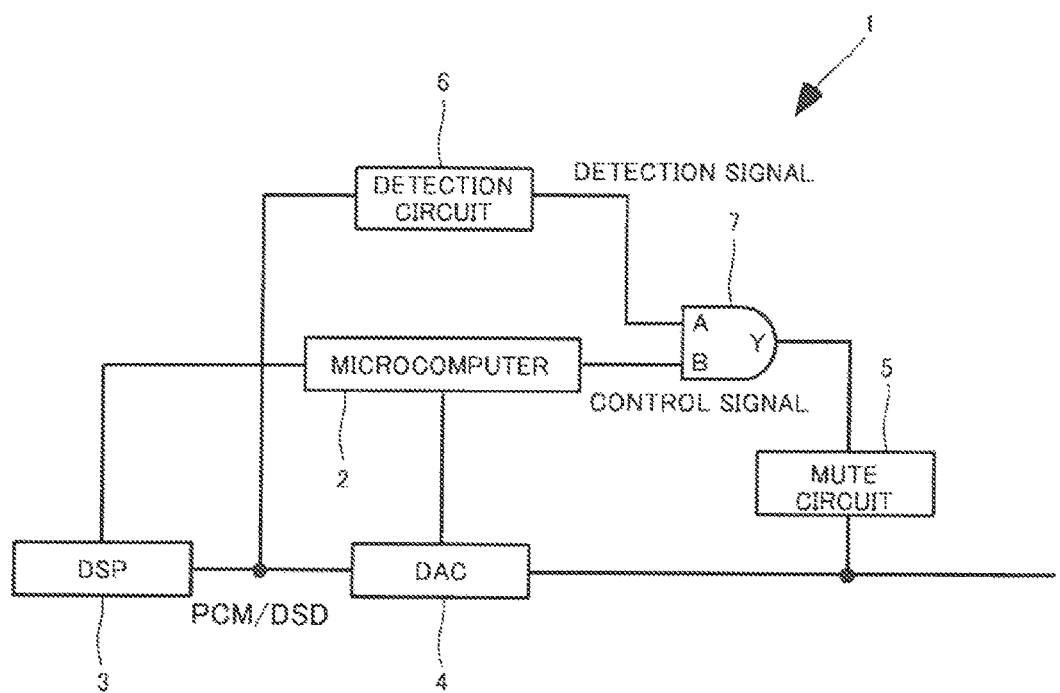
FIG. 1 is a block diagram illustrating a configuration of an AV receiver according to a first embodiment of the present invention.

FIG. 1 is a block diagram illustrating a configuration of an AV receiver according to an embodiment of the present invention. For example, an AV receiver 1 (audio processing device) includes a microcomputer 2, a DSP (Digital Signal Processor) 3, a D/A converter (hereinafter referred as to "DAC") 4, a mute circuit 5, a detection circuit 6, and an AND circuit 7. The microcomputer 2 controls respective sections composing the AV receiver 1. The DSP 3 performs digital signal processing such as sound field processing and equalizing processing to a digital audio signal.

The DAC 4 D/A-converts the digital audio signal that is output from the DSP 3 to an analog audio signal. The DAC 4 D/A-converts PCM data (first digital audio signal) and DSD data in which data format is different from PCM data (second digital audio signal) to the analog audio signal. The DAC 4 has PCM mode (first mode) that converts PCM data to the analog audio signal and DSD mode (second mode) that converts DSD data to the analog audio signal. The microcomputer 2 controls the mode of the DAC 4.

The mute circuit 5 (mute section) mutes output from the DAC 4. A signal from the AND circuit 7 is supplied to the mute circuit 5. The mute circuit 5 becomes ON state when a high level signal is supplied from the AND circuit 7. Accordingly, the mute circuit 5 mutes output from the DAC 4. The mute circuit 5 becomes OFF state when a low level signal is supplied from the AND circuit 7. Therefore, the mute circuit 5 does not mute output from the DAC 4.

Figure 2:
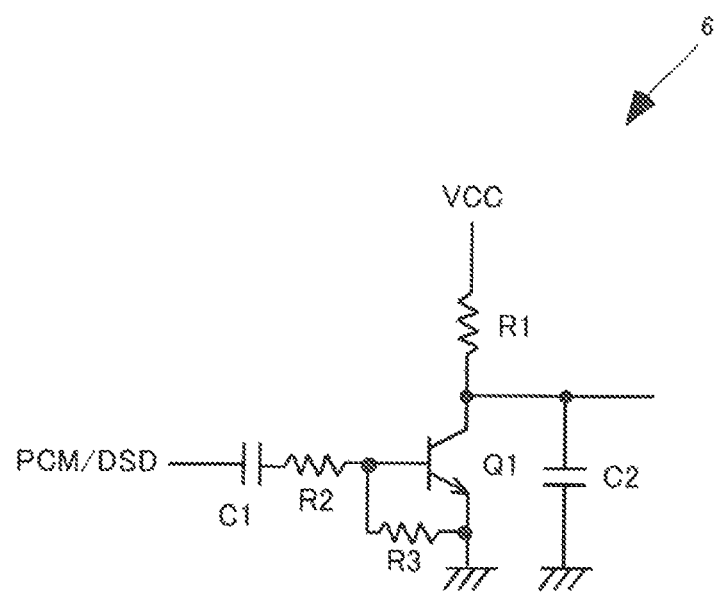
FIG. 2 is a diagram illustrating a circuit configuration of a detection circuit.

The detection circuit 6 (detection section) detects that the digital audio signal is zero data (zero signal) and supplies a detection signal. FIG. 2 is a diagram illustrating a circuit configuration of the detection circuit 6. As illustrated in FIG. 2, the detection circuit 6 has a bipolar transistor Q1. The bipolar transistor Q1 is an npn type, namely, a bipolar transistor that becomes ON state when base voltage is high level potential against emitter voltage. The digital audio signal (PCM data and DSD data) is input to a base of the bipolar transistor Q1. Further, a collector of the bipolar transistor Q1 is connected to a power source VCC via a resistor R1. Further, an emitter of the bipolar transistor Q1 is connected to the ground potential. Further, output of the detection circuit 6 is between the resistor R1 and the collector of the bipolar transistor Q1. Further, in the bipolar transistor Q1, a resistor R2 (emitter resistor) is connected between the base and the emitter. Further, a resistor R3 (base resistor) and a condenser C1 are connected to the base of the bipolar transistor Q1. Further, one end of a condenser C2 is connected to output of the detection circuit 6. Further, the other end of the condenser C2 is connected to the ground potential.

In case that the digital audio signal is zero data, the bipolar transistor Q1 becomes OFF state when a low level signal is input to the base of the bipolar transistor Q1. For this reason, the detection circuit 6 supplies a high level signal as the detection signal from output. Further, in case that the digital audio signal is not zero data, namely, data exists (PCM music signal or DSD music signal), a high level signal is input to the base of the bipolar transistor Q1 and the bipolar transistor Q1 becomes ON state. For this reason, the detection circuit 6 supplies a low level signal from output.

The AND circuit 7 (mute controller, AND section) controls the mute circuit 5. Concretely, the AND circuit 7 activates the mute circuit 5 in case that the detection signal from the detection circuit 6 and a control signal from the microcomputer 2 are supplied to the AND circuit 7. Herein, at timing switching from PCM data to DSD data, the microcomputer 2 supplies a high level signal as the control signal before it switches the DAC 4 from PCM mode to DSD mode.

One input terminal (A in FIG. 1) of the AND circuit 7 is connected to the detection circuit 6. Therefore, the signal from the detection circuit 6 is input to one input terminal (A in FIG. 1) of the AND circuit 7. Further, the other input terminal (B in FIG. 1) of the AND circuit 7 is connected to the microcomputer 2. Therefore, the signal from the microcomputer 2 is supplied to the other input terminal (B in FIG. 1) of the AND circuit 7. An output terminal (Y in FIG. 1) of the AND circuit 7 is connected to the mute circuit 5. Therefore, a signal from the AND circuit 7 is supplied to the mute circuit 5. The AND circuit 7 calculates logical AND of the signal supplied from the detection circuit 6 and the signal supplied from the microcomputer 2. The signal that the AND circuit 7 performs logical operation is supplied to the mute circuit 5.

FIG. 3 is a diagram illustrating logic of an input signal to the AND circuit 7 and an output signal from the AND circuit 7. In case that the signal from the detection circuit 6 is low level (L) and the signal from the microcomputer 2 is low level (L), the AND circuit 7 supplies a low level (L) signal to the mute circuit 5. Further, the signal from the detection circuit 6 is low level (L) and the signal from the microcomputer 2 is high level (H), the AND circuit 7 supplies the low level signal to the mute circuit 5. Further, the signal from the detection circuit 6 is high level (H) and the signal from the microcomputer 2 is low level (L), the AND circuit 7 supplies the low level signal to the mute circuit 5. Further, the signal from the detection circuit 6 is high level (H, detection signal) and the signal from the microcomputer 2 is high level (H, control signal), the AND circuit 7 supplies a high level signal to the mute circuit 5.

FIG. 4 is a diagram illustrating transition of an input signal to the AND circuit 7 and an output signal from the AND circuit 7 at timing switching from PCM data to DSD data.

1. When PCM data is PCM music signal, the low level (L) signal is input to one input terminal (A) of the AND circuit 7. Further, the microcomputer 2 outputs the low level (L)

signal to the other input terminal (B) of the AND circuit 7. Therefore, the low level (L) signal is supplied to the mute circuit 5 from the AND circuit 7 (Y). Further, the microcomputer 2 controls the DAC 4 in PCM mode. For this reason, the mute circuit 5 is OFF state and the DAC 4 is normal output state.

2. When PCM data becomes zero data, the high level (H) signal is input to one input terminal (A) of the AND circuit 7. Further, the microcomputer 2 outputs the low level (L) signal to the other input terminal (B) of the AND circuit 7. Therefore, the low level (L) signal is supplied to the mute circuit 5 from the AND circuit 7 (Y). Further, the microcomputer 2 controls the DAC 4 in PCM mode. For this reason, the mute circuit 5 is OFF state and the DAC 4 is silence output state when zero data of PCM data is input to the DAC 4.

3. When PCM data is zero data, the high level (H) signal (the detection signal) is input to one input terminal (A) of the AND circuit 7. Further, the microcomputer 2 outputs the high level (H) signal (the control signal) to the other input terminal (B) of the AND circuit 7. Therefore, the high level (H) signal is supplied to the mute circuit 5 from the AND circuit 7 (Y). Further, the microcomputer 2 controls the DAC 4 in PCM mode. For this reason, the mute circuit 5 is ON state and mutes output from the DAC 4.

4. When PCM data is zero data, the high level (H) signal (the detection signal) is input to one input terminal (A) of the AND circuit 7. Further, the microcomputer 2 outputs the high level (H) signal (the control signal) to the other input terminal (B) of the AND circuit 7. Therefore, the high level (H) signal is supplied to the mute circuit 5 from the AND circuit 7 (Y). Further, the microcomputer 2 switches the DAC 4 to DSD mode. For this reason, the mute circuit 5 is ON state and mutes output from the DAC 4. Thus, even if zero data is input to the DAC 4 in DSD mode, output from the DAC 4 is muted and noise does not occur.

5. When the signal becomes a mute signal of DSD data, the low level (L) signal is input to one input terminal (A) of the AND circuit 7. The high level signal is included in the mute signal of DSD data. Further, the microcomputer 2 outputs the high level (H) signal to the other input terminal (B) of the AND circuit 7. Therefore, the low level (L) signal is supplied to the mute circuit 5 from the AND circuit 7. Further, the microcomputer 2 controls the DAC 4 in DSD mode. For this reason, the mute circuit 5 is OFF state, the DAC 4 is silence output state when the mute signal of DSD data is input to the DAC 4.

6. When DSD data becomes DSD music signal, the low level signal (L) is input to one input terminal (A) of the AND circuit 7. Further, the microcomputer 2 outputs the high level (H) signal to the other input terminal (B) of the AND circuit 7. Therefore, the low level (L) signal is supplied to the mute circuit 5 from the AND circuit 7 (Y). Further, the microcomputer 2 controls the DAC 4 in DSD mode. For this reason, the mute circuit 5 is OFF state and the DAC 4 is normal output state.

As described in the above, in the present embodiment, the detection circuit 6 detects that the digital audio signal is zero data and supplies the detection signal. Further, at timing switching from PCM data to DSD data, the microcomputer 2 supplies the control signal before it switches the DAC 4 from PCM mode that the DAC 4 converts PCM data into the analog audio signal to DSD mode that the DAC 4 converts DSD data into the analog audio signal. Further, in case that the detection signal from the detection circuit 6 and the control signal from the microcomputer 2 are supplied to the AND circuit 7, the AND circuit 7 activates the mute circuit 5. Thus, at timing switching from PCM data to DSD data, even if the DAC 4 is DSD mode, output of the DAC 4 is muted and noise can be prevented from occurring. Further, the detection circuit 6 supplies the detection signal to the AND circuit 7 and the AND circuit 7 activates the mute circuit 5. For this reason, output of the DAC 4 can be muted quickly without via the microcomputer 2.

Like this, according to the present embodiment, at timing switching from PCM data to DSD data, noise can be prevented from occurring by a simple configuration adding the detection circuit 6 and the AND circuit 7 to a conventional AV receiver that includes the DAC 4, the mute circuit 5, and the microcomputer 2.

Second Embodiment

Figure 5:
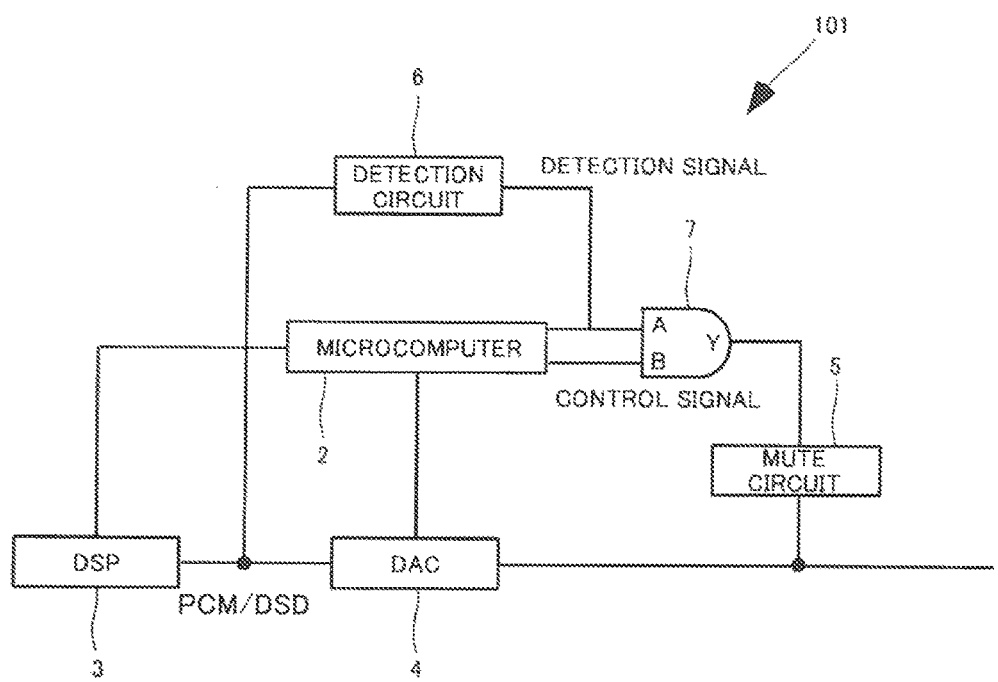
FIG. 5 is a block diagram illustrating a configuration of an AV receiver according to a second embodiment of the present invention.

FIG. 5 is a block diagram illustrating a configuration of an AV receiver according to an embodiment of the present invention. In the AV receiver 101 according to a second embodiment, compared to the AV receiver 1 according to the first embodiment, it is different that the detection signal from the detection circuit 6 is also supplied to the microcomputer 2. The detection circuit 6 is connected to the microcomputer 2.

FIG. 6 is a diagram illustrating transition of an input signal to the AND circuit 7 and an output signal from the AND circuit 7 at timing switching from DSD data to PCM data.

1. When DSD data is DSD music signal, the low level (L) signal is input to one input terminal (A) of the AND circuit 7. Further, the low level (L) signal is input to the microcomputer 2. Further, the microcomputer 2 outputs the high level (H) signal to the other input terminal (B) of the AND circuit 7. Therefore, the low level signal (L) is supplied to the mute circuit 5 from the AND circuit 7 (Y). Further, the microcomputer 2 controls the DAC 4 in DSD mode. For this reason, the mute circuit 5 is OFF state, and the DAC 4 is normal output state.

2. When DSD data becomes the mute signal, the low level (L) signal is input to one input terminal (A) of the AND circuit 7. The high level signal is included in the mute signal of DSD data. Further, the low level (L) signal is input to the microcomputer 2. Further, the microcomputer 2 outputs the high level (H) signal to the other input terminal (B) of the AND circuit 7. Therefore, the low level (L) signal is supplied to the mute circuit 5 from the AND circuit 7 (Y). Further, the microcomputer 2 controls the DAC 4 in DSD mode. For this reason, the mute circuit 5 is OFF state, and the DAC 4 is silence output state when the mute signal of DSD data is input to the DAC 4.

3. When the signal becomes zero data of PCM data, the high level (H) signal (the detection signal) is input to one input terminal (A) of the AND circuit 7. Further, the high level (H) signal (the detection signal) is input to the microcomputer 2. Further, the microcomputer 2 outputs the high level (H) signal (the control signal) to the other input terminal (B) of the AND circuit 7. Therefore, the high level (H) signal is supplied to the mute circuit 5 from the AND circuit 7 (Y). Further, the microcomputer 2 controls the DAC 4 in DSD mode. For this reason, the mute circuit 5 is ON state and mutes output from the DAC 4. Thus, even if zero data is input to the DAC 4 in DSD mode, output from the DAC 4 is muted and noise does not occur.

4. When PCM data is zero data, the high level (H) signal (the detection signal) is input to one input terminal (A) of the AND circuit 7. Further, the high level (H) signal (the detection signal) is input to the microcomputer 2. Further, the microcomputer 2 outputs the high level (H) signal (the control signal) to the other input terminal (B) of the AND circuit 7. Therefore, the high level (H) signal is supplied to the mute circuit 5 from the AND circuit 7 (Y). Further, the microcomputer 2 switches the DAC 4 to PCM mode. For this reason, the mute circuit 5 is ON state and mutes output from the DAC 4. Herein, the microcomputer 2 understands that the signal changes from the mute signal of DSD data to zero data of PCM data by the detection signal from the detection circuit 6. And, the microcomputer 2 switches the DAC 4 from DSD mode to PCM mode after the detection signal is supplied to the microcomputer 2.

5. When PCM data is zero date, the high level (H) signal (the detection signal) is input to one input terminal (A) of the AND circuit 7. Further, the high level (H) signal (the detection signal) is input to the microcomputer 2. Further, the microcomputer 2 outputs the low level (L) signal to the other input terminal (B) of the AND circuit 7. Therefore, the low level (L) signal is supplied to the mute circuit 5 from the AND circuit 7 (Y). Further, the microcomputer 2 controls the DAC 4 in PCM mode. For this reason, the mute circuit 5 is OFF state and the DAC 4 is silence output state when zero data of PCM data is input to the DAC 4.

6. When PCM data becomes PCM music signal, the low level (L) signal is input to one input terminal (A) of the AND circuit 7. Further, the low level (L) signal is input to the microcomputer 2. Further, the microcomputer 2 outputs the low level (L) signal to the other input terminal (B) of the AND circuit 7. Therefore, the low level (L) signal is supplied to the mute circuit 5 from the AND circuit 7 (Y). Further, the microcomputer 2 controls the DAC 4 in PCM mode. For this reason, the mute circuit 5 is OFF state and the DAC 4 is normal output state.

At timing switching from PCM data to DSD data, the operation of the AV receiver 101 according to the second embodiment is the same as the operation of the AV receiver 1 according to the first embodiment (see FIG. 4.).

As described in the above, in the present embodiment, the detection circuit 6 detects that the digital audio signal is zero data and supplies the detection signal. Further, at timing switching from DSD data to PCM data, in case that the detection signal is supplied to the microcomputer 2, the microcomputer 2 supplies the control signal. Next, the microcomputer 2 switches the DAC 4 from DSD mode that the DAC 4 converts DSD data into the analog audio signal to PCM mode that the DAC 4 converts PCM data into the analog audio signal. Further, in case that the detection signal from the detection circuit 6 and the control signal from the microcomputer 2 are supplied to the AND circuit 7, the AND circuit 7 activates the mute circuit 5. Like this, at timing switching from DSD data to PCM data, noise can be prevented from occurring because the microcomputer 2 detects that the digital audio signal changes from the mute signal of DSD data to zero data of PCM data and switches the DAC 4 from DSD mode to PCM mode.

Like this, according to the present embodiment, at timing switching from DSD data to PCM data, noise can be prevented from occurring by a simple configuration adding the detection circuit 6 and the AND circuit 7 to the conventional AV receiver that includes the DAC 4, the mute circuit 5, and the microcomputer 2.

Further, in the first and the second embodiment, the AND circuit 7 calculates logical AND of the signal supplied from the detection circuit 6 and the signal supplied from the microcomputer 2. For this reason, in case that the detection signal that is a high level signal and the control signal that is a high level signal are supplied to the AND circuit 7, the AND circuit 7 supplies the high level signal. The mute circuit 5 mutes output from the DAC 4 when the high level signal from the AND circuit 7 is supplied to the mute circuit 5. Like this, according to the present embodiment, at timing switching between PCM data and DSD data, noise can be prevented from occurring by a simple circuit configuration using the AND circuit 7.

Further, in the first and the second embodiment, the digital audio signal is input to the base of the npn type bipolar transistor Q1 that configures the detection circuit 6. Further, the collector of the bipolar transistor Q1 is connected to the power source VCC via the resistor R1. Further, the emitter of the bipolar transistor Q1 is connected to the ground potential. Further, output of the detection circuit 6 is between the resistor R1 and the collector of the bipolar transistor Q1.

Therefore, in case that the digital audio signal is zero data, the bipolar transistor Q1 becomes OFF state when the low level signal is input to the base of bipolar transistor Q1. For this reason, the detection circuit 6 outputs the high level signal as the detection signal from output. Like this, according to the present embodiment, that the digital audio signal is zero data can be detected by the detection circuit 6 of a simple configuration using the bipolar transistor Q1.

Third Embodiment

Figure 8:
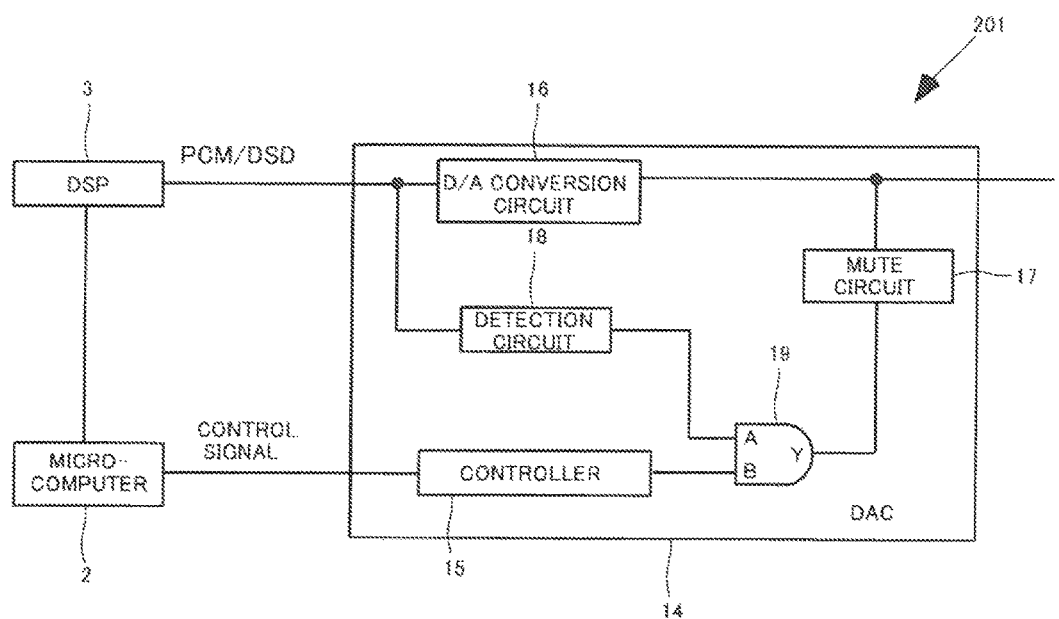
FIG. 8 is a block diagram illustrating a configuration of an AV receiver according to a third embodiment of the present invention.

FIG. 8 is a block diagram illustrating a configuration of an AV receiver according to the embodiment of the present embodiment. As illustrated in FIG. 8, the AV receiver 201 includes the microcomputer 2, the DSP 3, and a DAC 14 (audio processing device). In the AV receiver 201 according to the third embodiment, compared with the AV receiver 1 according to the first embodiment, it is mainly different that a mute circuit 17, a detection circuit 18, and an AND circuit 19 are embedded in the DAC 14 and they becomes one chip.

The DAC 14 includes a controller 15, a D/A conversion circuit 16, the mute circuit 17, the detection circuit 18, and the AND circuit 19. At timing switching from PCM data to DSD data, the controller 15 (controller) performs the same processing as the microcomputer 2 in the first embodiment. The D/A conversion circuit 16 (D/A converter) corresponds to the DAC 4. The mute circuit 17 (mute section) corresponds to the mute circuit 5. The detection circuit 18 (detection section) corresponds to the detection circuit 6. The AND circuit 19 (mute control section, AND section) corresponds to the AND circuit 7.

Processing at timing switching from PCM data to DSD data in the AV receiver 201 is the same as the above mentioned processing illustrated in FIG. 4 and is performed by the controller 15 that performs the same processing as the microcomputer 2, the mute circuit 17 that corresponds to the mute circuit 5, the detection circuit 18 that corresponds to the detection circuit 6, and the AND circuit 19 that corresponds to the AND circuit 7. Thus, the explanation is omitted.

Fourth Embodiment

Figure 9:
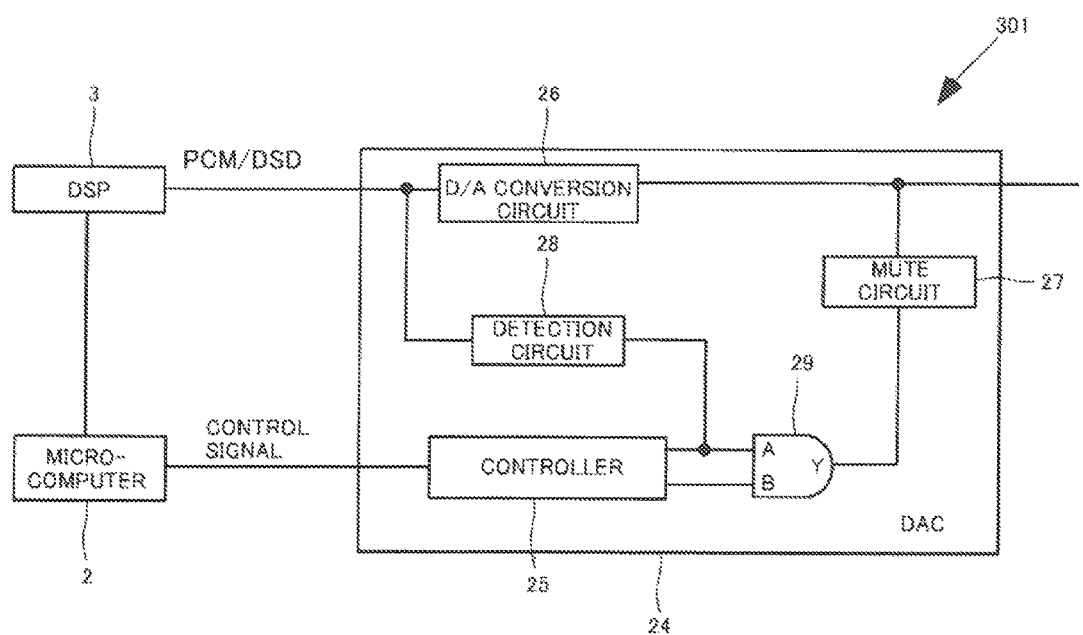
FIG. 9 is a block diagram illustrating a configuration of an AV receiver according to a fourth embodiment of the present invention.

FIG. 9 is a block diagram illustrating a configuration of an AV receiver according to an embodiment of the present invention. As illustrated in FIG. 9, the AV receiver 301 includes the microcomputer 2, the DSP 3, and a DAC 24 (audio processing device). In the AV receiver 301 according to the fourth embodiment, compared with the AV receiver 101 according to the second embodiment, it is mainly different that a mute circuit 27, a detection circuit 28, and an AND circuit 29 are embedded in the DAC 24 and they becomes one chip.

The DAC 24 includes a controller 25, a D/A conversion circuit 26, the mute circuit 27, the detection circuit 28, and the AND circuit 29. At timing switching from DSD data to PCM data and at the timing switching from PCM data to DSD data, the controller 25 (controller) performs the same processing as the microcomputer 2 in the second embodiment. The D/A conversion circuit 26 (D/A converter) corresponds to the DAC 4. The mute circuit 27 (mute section) corresponds to the mute circuit 5. The detection circuit 28 (detection section) corresponds to the detection circuit 6. The AND circuit 29 (mute control section, AND section) corresponds to the AND circuit 7.

Processing at timing switching from DSD data to PCM data in the AV receiver 301 is the same as the above mentioned processing illustrated in FIG. 6 and is performed by the controller 25 that performs the same processing as the microcomputer 2, the mute circuit 27 that corresponds to the mute circuit 5, the detection circuit 28 that corresponds to the detection circuit 6, and the AND circuit 29 that corresponds to the AND circuit 7. Thus, the explanation is omitted.

Further, Processing at timing switching from PCM data to DSD data in the AV receiver 301 is the same as the above mentioned processing illustrated in FIG. 4 and is performed by the controller 25 that performs the same processing as the microcomputer 2, the mute circuit 27 that corresponds to the mute circuit 5, the detection circuit 28 that corresponds to the detection circuit 6, and the AND circuit 29 that corresponds to the AND circuit 7. Thus, the explanation is omitted.

The embodiment of the present invention is described above, but the mode to which the present invention is applicable is not limited to the above embodiment and can be suitably varied without departing from the scope of the present invention.

Figure 7:
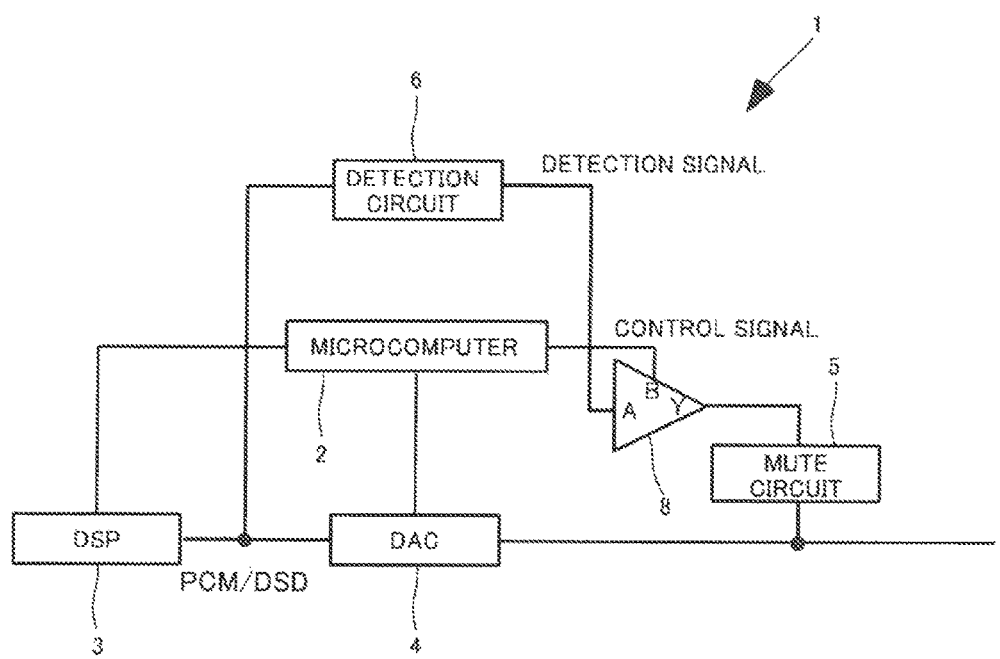
FIG. 7 is a block diagram illustrating a configuration of an AV receiver according to a variation.

In the above mentioned embodiment, the AND circuit 7 is illustrated as a mute control circuit. Not limited to this, as illustrated in FIG. 7, a three state buffer 8 may be used instead of the AND circuit 7. In case that the signal from the detection circuit 6 is low level (L) and the signal from the microcomputer 2 is low level (L), output (Y) from the three state buffer 8 becomes high impedance (Hi-z). When output (Y) from the three state buffer 8 is pulled down, it is fixed to low level. Further, in FIG. 7, in the AV receiver 1 according to the first embodiment, an example using the three state buffer 8 is illustrated. In the AV receiver 101 according to the second embodiment, the three state buffer 8 can be used similarly.

In the above mentioned embodiment, the detection circuit 6 supplies the high level signal as the detection signal. Further, the microcomputer 2 outputs the high level signal as the control signal. Further, the mute circuit 5 mutes output from the DAC 4 when the high level signal is supplied to the mute circuit 5 from the AND circuit 7 (the three state buffer 8). The detection signal, the control signal, and the logic that the mute circuit 5 becomes ON are not limited to this. For example, the detection signal and the control signal may be the low level. Further, the mute circuit 5 may mute output from the DAC 4 when the low level signal is supplied to the mute circuit 5.

In the above mentioned embodiment, the AV receiver is illustrated as an audio processing device. Not limited to this, it may be other audio processing device.

In the above mentioned embodiment, PCM data as a first digital audio signal and DSD data as a second digital audio signal are illustrated. Not limited to this, it is suffice that data format of the first digital audio signal and the second digital audio signal is different from each other.

Processing that is performed by the detection circuit 6 and the AND circuit 7 in above mentioned embodiment maybe processed by a software.

The present invention can be suitably employed in the audio processing device that performs audio signal processing to the digital audio signal.

What is claimed is:

1. An audio processing device comprising:
   a D/A converter that converts a first digital audio signal and a second digital audio signal in which data format is different from the first digital audio signal into an analog audio signal;
   a mute circuit that mutes output from the D/A converter;
   a detection circuit that detects that a digital audio signal is a zero signal and supplies a detection signal;
   a controller that supplies a control signal at timing switching from the first digital audio signal to the second digital audio signal before switching the D/A converter from a first mode that the D/A converter converts the first digital audio signal into the analog audio signal to a second mode that the D/A converter converts the second digital audio signal into the analog audio signal; and
   a mute controller that activates the mute circuit in case that the detection signal from the detection circuit and the control signal from the controller are supplied to the mute controller.

2. The audio processing device according to claim 1, wherein the detection circuit supplies a high level signal as the detection signal,
   the controller supplies a high level signal as the control signal,
   the mute controller is an AND circuit that calculates logical AND of the signal supplied from the detection circuit and the signal supplied from the controller, and
   the mute circuit mutes output from the D/A converter when the high level signal is supplied to the mute circuit from the mute controller.

3. The audio processing device according to claim 1, wherein the detection circuit supplies a high level signal as the detection signal,
   the controller supplies a high level signal as the control signal,
   the mute controller is a three state buffer to which the signal that is supplied from the detection circuit and the signal that is supplied from the controller are input, and
   the mute circuit mutes output from the D/A converter when the high level signal is supplied to the mute circuit from the mute controller.

4. The audio processing device according to claim 1, wherein the detection circuit has an npn type bipolar transistor,
   the digital audio signal is input to a base of the bipolar transistor,
   a collector of the bipolar transistor is connected to a power source via a resistor,
   an emitter of the bipolar transistor is connected to a ground potential, and output of the detection circuit is between the resistor and the collector of the bipolar transistor.

5. The audio processing device according to claim 1, wherein the controller switches the D/A converter from the first mode to the second mode after it supplies the control signal.

6. The audio processing device according to of claim 1, wherein the first digital audio signal is pulse-code modulation data, and the second digital signal is direct stream digital signal.

7. An audio processing device comprising: a D/A converter that converts a first digital audio signal and a second digital audio signal in which data format is different from the first digital audio signal into an analog audio signal;
   a mute circuit that mutes output from the D/A converter;
   a detection circuit that detects that a digital audio signal is a zero signal and supplies a detection signal;
   a controller that switches the D/A converter from a second mode that the D/A converter converts the second digital audio signal into the analog audio signal to a first mode that the D/A converter converts the first digital audio signal into the analog audio signal at timing switching from the second digital audio signal to the first digital audio signal after the controller outputs a control signal in case that the detection signal is supplied to the controller; and
   a mute controller that activates the mute circuit in case that the detection signal form from the detection circuit and the control signal from the controller are supplied to the mute controller.

* * * * *